United States Patent [19]
Takayama et al.

[11] 3,981,006
[45] Sept. 14, 1976

[54] SIGNAL TRANSMITTING APPARATUS USING A/D CONVERTER AND MONOSTABLE CONTROL CIRCUIT

[75] Inventors: Jun Takayama, Kokubunji; Takenori Sonoda; Shoichi Nakamura, both of Tokyo, all of Japan

[73] Assignee: Sony Corporation, Tokyo, Japan

[22] Filed: June 21, 1974

[21] Appl. No.: 481,806

[30] Foreign Application Priority Data
July 6, 1973   Japan.............................. 48-76392

[52] U.S. Cl..................... 340/347 AD; 340/347 DA
[51] Int. Cl.² ........................................ H03K 13/02
[58] Field of Search............. 340/347 AD, 247, 274; 324/115, 116

[56] References Cited
UNITED STATES PATENTS

| | | | |
|---|---|---|---|
| 3,012,195 | 12/1961 | Slocomb | 340/347 AD |
| 3,133,278 | 5/1964 | Millis | 340/347 AD |
| 3,187,323 | 6/1965 | Flood | 340/347 AD |
| 3,216,003 | 11/1965 | Funk et al. | 340/347 |
| 3,313,924 | 4/1967 | Schulz | 340/347 AD |
| 3,480,948 | 11/1969 | Lord | 340/347 |
| 3,516,085 | 6/1970 | Dano | 340/347 AD |
| 3,525,948 | 8/1970 | Sherer | 340/347 AD |
| 3,578,988 | 5/1971 | Slowikowski | 307/265 |
| 3,646,548 | 2/1972 | Van Doren | 340/347 AD |
| 3,696,399 | 10/1973 | Klein et al. | 340/347 AD |
| 3,735,154 | 11/1971 | Meeker et al. | 307/273 |
| 3,757,142 | 9/1973 | Palazetti | 307/273 |

*Primary Examiner*—Charles D. Miller
*Attorney, Agent, or Firm*—Alvin Sinderbrand; Lewis H. Eslinger

[57] ABSTRACT

An amplitude adjustment circuit transmits an analog signal to an analog-to-digital converter. If the resulting digital signal reaches the maximum permissible digital value, a monostable control circuit is triggered to cause the amplitude adjustment circuit to reduce the level of the analog signal a certain amount. If the digital signal again reaches the maximum permissible digital value before the control circuit returns to its stable condition a second monostable circuit is triggered (and the first one is retriggered) to cause the amplitude adjustment circuit to reduce the level of the analog signal another amount. The unstable interval for the second monostable circuit is shorter than for the first, and, in the absence of further triggering, both such circuits return to their stable states in succession. The digital signals are used to reconstruct the analog signal in apparatus similar to the encoding apparatus and including amplitude adjustment apparatus controlled by the amplitude compression signals.

6 Claims, 6 Drawing Figures

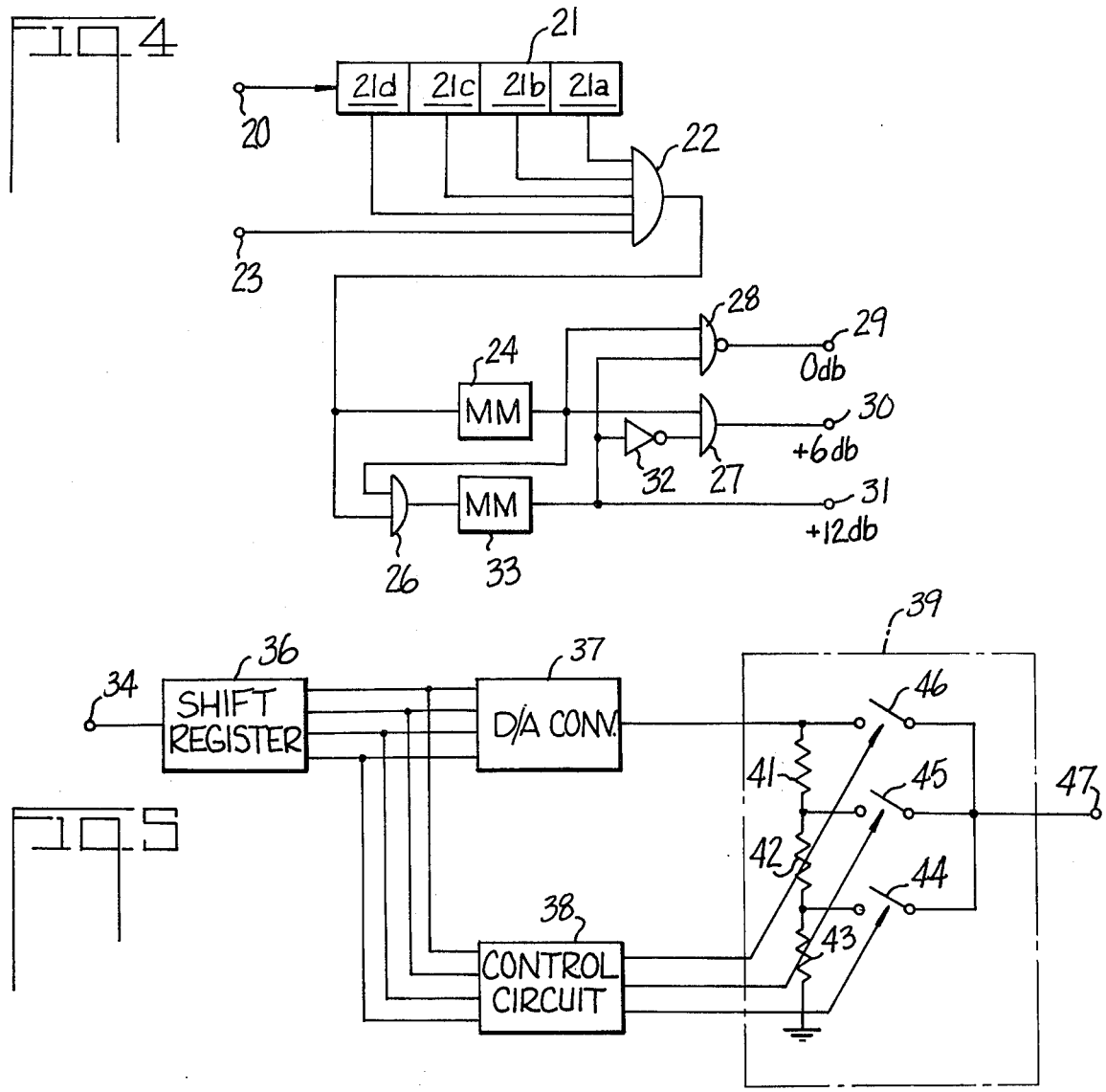
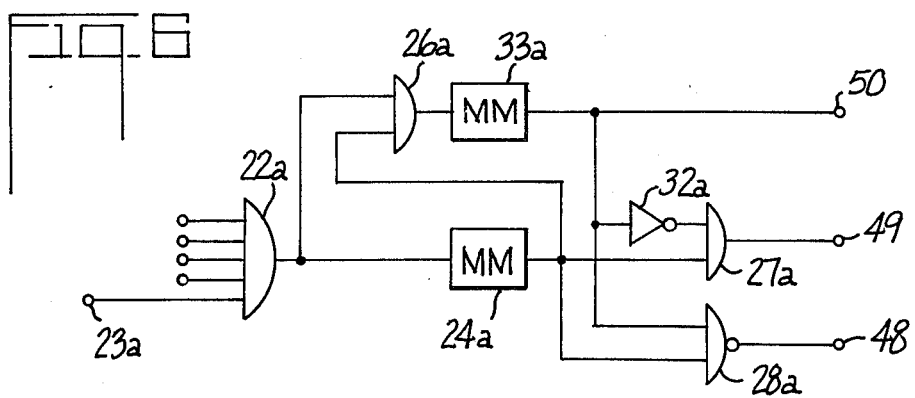

SIGNAL TRANSMITTING APPARATUS USING A/D CONVERTER AND MONOSTABLE CONTROL CIRCUIT

BACKGROUND OF THE INVENTION

1. Field of the Invention

This invention relates to a system in which analog signals are transformed into digital signals by encoding apparatus that includes an amplitude adjustment means actuated for a limited time to permit analog signals of greater amplitude to be digitally encoded. The invention further relates to transformation of the digital signals back into analog form, including means actuated for a limited time to allow transformation of properly encoded signals back to greater amplitude analog signals. In either type of transformation certain digital signals are used to control the amplitude adjustment apparatus to expand the amplitude of analog signals that may be handled without correspondingly expanding the number of digits that must be used.

2. The Prior Art

When it is desired to process analog signals by means of apparatus capable of handling only digital signals, the analog signals must be converted into digital signals. Basically, this involves selecting the number of digits that one is willing to use, and then assigning a number of levels to the analog range, each level corresponding to a digital increment. For example, if four digits are to be used, the maximum number of analog steps can be fifteen, since the decimal equivalent of the binary number 1111 is $2^4-1$, or 15. This maximum decimal value is then considered to be equal to the maximum analog signal amplitude and any signal value below that maximum corresponds to a certain digital number. For example, the first increment corresponds to the digital number 1, the second to the digital number 10, and so on.

The analog signal can be reconstructed by transforming the digital signal back into analog form. The reconstructed analog signal may not have a smooth variation from one level to the next unless it is possible to use a smoothing filter. However, the greater the number of increments, the more closely the waveform of the reconstructed analog signal will correspond to the original signal, provided there is time to carry out the quantizing procedure at each step.

The actual magnitude of the analog signal does not affect the quality of the reconstructed signal; if the encoding apparatus is designed to encode an analog signal having a maximum peak value of one volt (an arbitarily chosen value) and the actual signal is 10 volts, it has been the practice heretofore to attenuate the actual signal to the acceptable value. On the other hand, if the actual signal is only a fraction of a volt, the practice has been to amplify it to the desired value. In any case once the amplitude of the analog signal was adjusted so that the maximum value of the signal could be accommodated by encoding apparatus with peak values of the analog signal using all or almost all of the available digital increments, the number of available increments was determined by the number of binary digits, and it was impossible to accommodate peaks of the analog signal that exceeded the predetermined level selected as the maximum. It would be possible to increase the number of binary digits but before doing so it is necessary to take into account the frequency range of the apparatus, such as a transmission line, through which the binary signals would have to be passed. A larger number of digits means more complex and more expensive equipment or a limitation in the frequency range of the analog signals.

In co-pending application entitled TRANSMITTING APPARATUS USING A/D CONVERTER AND ANALOG SIGNAL COMPRESSION AND EXPANSION, filed June 21, 1974, Ser. No. 481,804, by Jun Takayama and Takenori Sonoda, a system is described for controlling the amplitude of the analog signal to reduce its peak values before encoding it into a digital form and to expand it when it is reconstructed into analog form. The amplitude is changed by detecting a first digital signal corresponding to the maximum permissible digital value for the encoder and using that detected signal to compress the amplitude of the analog signal to be encoded. The same digital value can then be used in decoding the signal to expand the reconstructed analog signal.

A second digital value corresponding to approximately half the maximum permissible, or full scale, analog value would then be used to return the amplitude of the analog signal, before encoding or after decoding, to the original value.

However, transmission of the encoded digital signals may result occasionally in dropping out the important amplitude adjustment signals, either the compression or the expansion signal, with an attendant distortion of the reconstructed analog signal.

It is one object of the present invention to provide conversion apparatus for use in analog-to-digital and digital-to-analog conversion systems to accommodate higher peak values of the analog signal without increasing the number of binary digits by using a pattern, or code of the binary signal to change the amplitude of the analog signal in conversion, and in making these conversions, to take advantage of the fact that the signal does not remain long at its peak value, thus making it possible to control the time that the amplitude is expanded.

Further objects will become apparent from the following specification together with the drawings.

BRIEF DESCRIPTION OF THE INVENTION

In accordance with the present invention, there is provided in the analog-to-digital part of the apparatus an amplitude adjustment section that adjusts the amplitude of the analog signal to certain related ranges of values. The apparatus also comprises means including monostable multivibrators to detect certain digital relationships in the converted signal, and to use those relationships to control the amplitude adjustment section. Thus, when the magnitude of the original analog signal reaches a first predetermined level, as determined by a first digital signal, the effective increment of the quantizing steps in the encoding apparatus is increased, and when the magnitude of the analog signal increases above a second predetermined level as determined by again producing the same digital signal, the incremental value of the quantizing steps is again increased. Due to the fact that the monostable multivibrators remain in their actuated condition for only a limited time, the compression will cease when the monostable circuits reach the end of their allotted times, without any signal to cease compression.

BRIEF DESCRIPTION OF THE DRAWINGS

FIG. 4 is a schematic diagram of the control circuit section of the conversion apparatus illustrated in FIG. 2.

FIG. 5 is a block diagram of a basic digital-to-analog conversion system according to the present invention.

FIG. 6 is a schematic diagram of the control circuit in the digital-to-analog conversion apparatus of FIG. 5.

DESCRIPTION OF THE PREFERRED EMBODIMENTS

Figure 1:
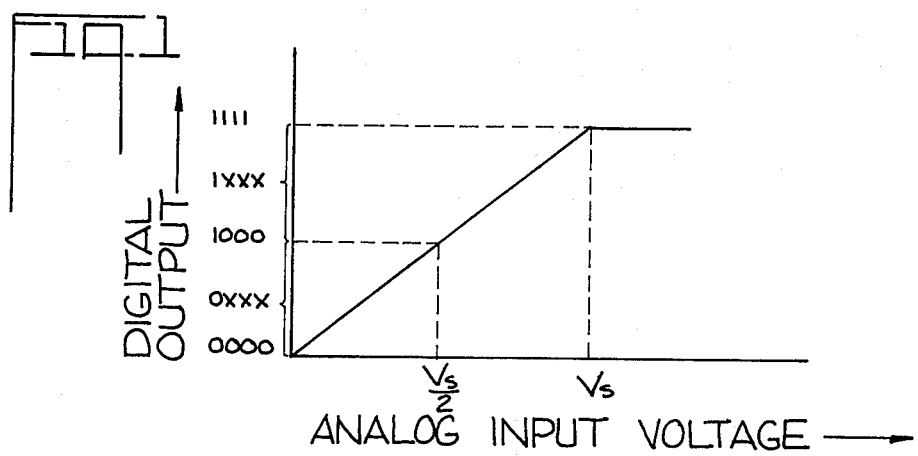
FIG. 1 is a graph showing the relationship between analog signal values and digital values in analog-to-digital converters of the prior art.

The graph in FIG. 1 shows the input-output characteristic of an analog-to-digital (A/D) converter capable of accepting a uni-polar analog signal, that is, an analog signal that varies in magnitude but not in polarity, and encoding it according to a four-bit digital code. The digital output signal scaled by a four-bit binary signal is plotted on the ordinate, and the analog input voltage is plotted along the abscissa. The analog input signal having a value between zero volts and $V_s$ volts is converted linearly to the corresponding uni-polar four-bit digital signal according to the magnitude of the input analog signal. As is indicated by the horizontal line in the graph following the sloping section, analog signal values above $V_s$ volts are simply converted into a constant four-bit binary digital signal having a binary value 1111. Thus the analog voltage reaches a saturation value at the value $V_s$ of the A/D converter. This saturation value is also referred to as the full scale voltage. The graph illustrates another value which is utilized in the present invention and which is referred to as half-scale voltage.

In the A/D converter that operates according to the graph in FIG. 1, the digital code value 0000 corresponds to an analog input signal of) volts and the digital value 1000 is defined as the half-scale voltage ($V_s/2$, although it is slightly larger than one-half the value $V_s$. The full scale voltage $V_s$ corresponds to the binary number 1111 in the digital signal. According to the input-output characteristic of the A/D converter, shown in FIG. 1, it is a simple matter to find out when the analog signal reaches the full scale voltage $V_s$ by detecting the existence of the binary code 1111.

Figure 2:
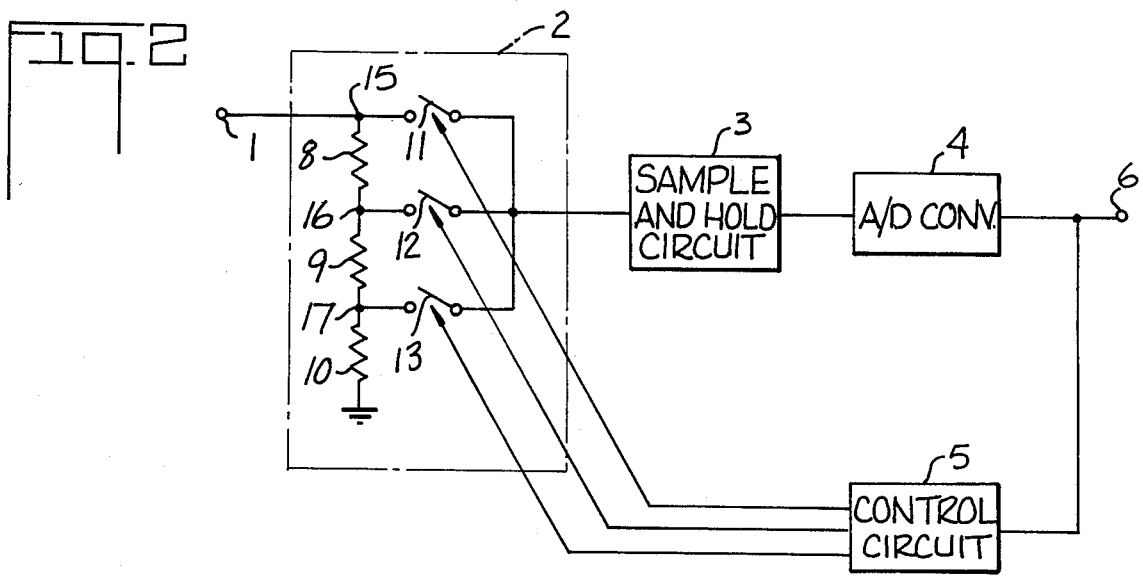
FIG. 2 is a block diagram of basic apparatus for converting analog signals to digital signals including a control circuit according to the present invention.

FIG. 2 shows a block diagram of the basic components of an A/D conversion system with compression of high-amplitude analog signals relative to low-amplitude analog signals, according to the present invention. The analog input signal is applied between an input terminal 1 and ground. These are the input terminals for an amplitude adjustment circuit 2 which, in this embodiment, is illustrated as a variable attenuator. The output of the attenuator is connected to a sample-and-hold circuit 3, and the output of the latter circuit is applied to an A/D converter 4 that encodes the analog signal information in digital form. The digital output signal from the A/D converter 4 is supplied to a control circuit 5 and to an output terminal 6.

The attenuator in the amplitude adjustment circuit 2 includes three resistors 8–10. Selected points along the attenuator are connected individually, but not simultaneously, to the sample-and-hold circuit 3 by three switching means 11–13, which are illustrated as if they were mechanical switches but which in fact are normally electronic switching circuits. The switching means 11 is connected to the top point 15 of the attenuator to receive the full analog voltage applied to the input terminal 1. The second switching means 12 is connected to a common circuit point 16 between the resistors 8 and 9 to receive an attenuated version of the input analog signal, attenuated by approximately 6db with respect to the full analog signal applied to the terminal 1. Thus the voltage at the point 16 is one-half the voltage at the point 15. The third switching means 13 is connected to a common circuit point 17 between the resistors 9 and 10 to receive a further attenuated replica of the analog signal. The value of the analog signal at the circuit point 17 is attenuated approximately 12db with respect to the incoming signal at the terminal 15, which means that the voltage at the point 17 is one-half the voltage at the point 16 and one-fourth the voltage at the point 15. The switching means 11–13 are individually and alternatively controlled by the control circuit 5 in response to a measured digital signal at the output of the A/D converter 4.

The operation of the circuit in FIG. 2 will be described in conjunction with the graph in FIG. 3. For values of analog signal applied to the terminal 1 and within the amplitude acceptable to the sample-and-hold circuit 3 and the A/D converter 4, the latter produces digital signals in a binary code and with a linear relationship between the binary numbers and the amplitude of the analog signal. This takes place in section (a) of the graph in FIG. 3 until the analog signal reaches an amplitude such as to cause the production of the digital signal 1111. This is the highest digital signal capable of being produced by the converter 4. The sample-and-hold circuit 3 does not transmit the analog signal in its original form but, in effect, transmits samples of it at a certain rate. The amplitude of each sample is the amplitude of the analog signal at the time the sample is taken, and the sample-and-hold circuit has the characteristic of being able to maintain an output voltage equal or substantially equal that value until the next sample is taken. Thus an analog signal that varies smoothly in amplitude is transformed by the sample-and-hold circuit into a waveform that somewhat resembles a staircase, although the rise between successive steps is not necessarily constant. This type of signal is effectively a pulse-amplitude modulation (PAM) signal, and it is really this PAM signal that is applied to the A/D converter 4. Within the interval between successive samplings of the original analog signal by the sample-and-hold circuit 3, the A/D converter 4 must produce a digital signal having a value that corresponds to the amplitude of the sample then being held by the sample-and-hold circuit.

The technique may be most clearly described by arbitrarily selecting a suitable analog signal waveform and set of voltage values. Let it be assumed that the waveform is a sawtooth wave that increases linearly with time and that it starts at zero value at time zero. Assume further that the rate at which it increases it one volt during each sampling interval. Such a signal would be transformed by the sample-and-hold circuit 3 into a true staircase signal having equal rise between successive level values. The level values would be one volt apart and thus it can be assumed that the digital signal at the output of the A/D converter 4 would have a waveform corresponding to the binary number system 1, 10, 11, 100, etc., as the analog voltage goes to the levels of 1v., 2v., 3v., 4v., etc.

When the analog voltage reaches the level of 15v., the digital signal reaches the value of 1111 and can go no higher. In accordance with the present invention, the 1111 signal at the output of the A/D converter 4 is recognized by a control circuit 5 and is applied to open the switching means 11 and close the switching means 12. This occurs at the end of the section (a) of the graph in FIG. 3. The values of the resistors 8–10 are selected so that the input analog signal to the terminal 1 is attenuated by approximately 6db at the terminal connected to the intermediate point 16.

Figure 3:
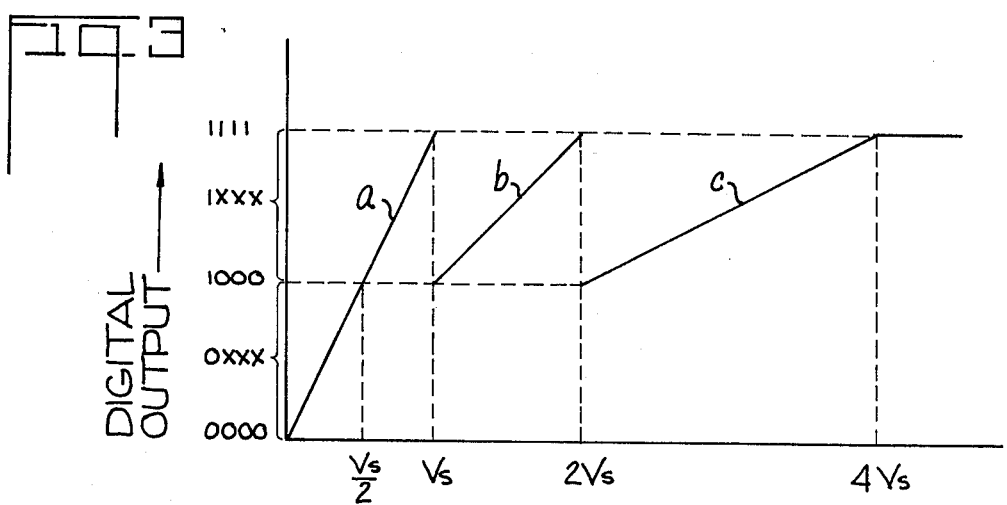
FIG. 3 is a graph illustrating the relationship between analog signal values and digital signals in accordance with the present invention.

As the analog voltage continues to increase along the line (b) in FIG. 3, which is simply equivalent to an attenuated extension of the section (a) of the graph, the attenuated voltage is sampled and held by the circuit 3 in the same manner as was done with the original part of the analog signal. However, instead of starting at zero, the attenuated voltage (b) starts at the level that corresponds to the digital signal 1000, which is approximately half of the maximum digital value of 1111. The attenuation of the analog signal by the amplitude setting circuit 2 in FIG. 2 is such that the amplitude of the analog signal does not drop below a value that would cause the A/D converter 4 to generate a digital signal of 1000.

Each 1 volt increment in the attenuated signal as passed through the switching means 12 to the sample-and-hold circuit 3 now corresponds to a 2 volt increment in the actual analog signal applied to the input terminal 1. It is assumed in the numerical example being used to describe this invention that the binary number corresponding to the digital signal produced by the A/D converter 4 will change one unit only when the output voltage of the sample-and-hold circuit 3 changes by 1 volt. Since this happens only when the input signal to the terminal 1 increases by 2 volts, the A/D converter 4 will generate a different binary number only every second step of the staircase type signal produced by the sample-and-hold circuit 3 in section (b) of the graph in FIG. 3. This continues until the binary number corresponding to the digital signal produced by the A/D converter 4 again reaches the value 1111, which now corresponds to an analog voltage twice as great as the analog voltage when the A/D converter 4 reached the value 1111 at the end of the section (a) of the graph in FIG. 3.

The second time the A/D converter 4 reaches the value 1111 at the end of section (b) of the graph of FIG. 3, the control circuit 5 receives another signal that causes the switching means 12 to be opened and the switching means 13 to be closed. The values of the resistors 8–10 are selected so that this produces another 6db reduction in the amplitude of the output signal as applied to the sample-and-hold circuit 3. In FIG. 3 this corresponds to dropping from the peak value in section (b) of the graph to the lower end of section (c). As will be noticed, the attenuation of the analog signal again does not drop quite half way and does not drop below a level such that the reading of the A/D converter 4 at the beginning of section (c) of the graph in FIG. 3 would be 1000.

The A/D converter 4 can continue to generate a binary signal as indicated by section (c) of the graph in FIG. 3, but now the input analog signal to the terminal 1 must increase four volts for each unit change in the binary number corresponding to the output signal of the A/D converter 4. Since the attenuator shown in the amplitude setting circuit 2 has only three positions, when the amplitude of the analog signal applied to the terminal 1 reaches a value of four times the original full scale voltage at the end of section (a) of the graph in FIG. 3, the system may be said to be saturated, and still further increases in the amplitude of the voltage at the terminal 1 will not change the value of the digital signal derived from the A/D converter 4 from its value of 1111.

FIG. 4 shows in greater detail a schematic diagram of the control circuit 5 in FIG. 2. The circuit in FIG. 4 has an input terminal 20 connected to the sample-and-hold circuit 3 in FIG. 2. The input terminal is connected to the input of a four-bit shift register 21 which has one section for each of the bits of the signal produced by the A/D converter 4. Each of these section 21a—21d is connected to a separate input terminal of an AND gate 22. A sampling pulse signal, which may be the same as the sampling signal for the sample-and-hold circuit 3 in FIG. 2, is also connected to an input terminal 23 of the AND gate 22. The output terminal of the AND gate 22 is connected to a triggering input terminal of a first monostable multivibrator 24 and to one input terminal of a second AND gate 26. The output terminal of the monostable multivibrator 24 is connected to a second input terminal of the gate 26, to an input terminal of a third AND gate 27, and to an input terminal of a NOR gate 28. The NOR gate has an output terminal 29, which is one of three control circuit output terminals 29-31 connected, respectively, to the switching means 11-13 in FIG. 2. The output terminal of the AND gate 26 is connected to an input terminal of a second monostable multivibrator 33, and the output terminal of this monostable multivibrator is connected to the control circuit output terminal 31, to an input terminal of an inverter 32, and to the second input terminal of the NOR gate 28. The output terminal of the inverter 32 is connected to the second input terminal of the AND gate 27, and the output of the AND gate 27 is also the control circuit output terminal 30.

The operation of the circuit in FIG. 4 will be described in conjunction with the circuit in FIG. 2. The initial values of the output voltage levels of the output terminals 29–31 in FIG. 4 are such as to render only one of the switching means 11-13 in FIG. 2 conductive at a time. In accordance with the invention, when the value of an analog signal applied to the input terminal 1 is low, the switching means 11 is the one that must be conductive to connect the analog signal to the sample-and-hold circuit 3 and on to the A/D converter 4. This requires that the output terminal 29 in FIG. 4 have an initial value of "1" and that the output terminals 30 and 31 have initial values of "0". This combination of signals corresponds to the fact that each of the monostable multivibrators 24 and 33 is initially in its stable, or quiescent, condition which means that the value of the signal level at their respective output terminals is 0. Since the 0 signals are applied to both of the input terminals of the NOR gate 28, the output terminal of the NOR gate, which is connected to the output terminal 29 is at the 1 level, as required. On the other hand, the fact that the output terminal of the monostable multivibrator 33 is zero, causes the output terminal 31 to have an initial value of 0, and this is also the required initial value. The voltage level output terminal 30 that controls the switching means 12 in FIG. 2 is determined by the output value of the signal voltage level at the AND gate 27. Since one of the input signal levels to this AND gate, the level at the output terminals of the monostable multivibrator 24, is 0, the output terminal of the AND gate 27 has the required 0 level, and so does the output terminal 30 connected directly to it. Thus, all three of the initial conditions to allow only the switching means 11 in FIG. 2 to be conductive and the other two switching means 12 and 13 to be initially nonconductive are met, and the analog signal can pass from the input terminal 1 through the sample-and-hold circuit 3 to be converted into a digital signal by the A/D converter 4.

When an analog signal voltage applied to the input terminal 1 to FIG. 2 has a value of zero. it is converted by the A/D converter 4 into a digital signal 0000. As the magnitude of the analog signal increases, the binary values of the digital signal produced by the A/D converter 4 in translating this analog signal into binary form increase until the analog signal reaches the full scale voltage, which converts into the digital value 1111. When the digital signal of the output terminal 6 in FIG. 2 applied to the input terminal 20 of the shift register 21 in FIG. 4 has the value 1111, the output signal of each of the sections 21a–21d of the shift register has the value 1, thereby enabling this AND gate. When the next sampling pulse signal is applied to the input terminal 23, the AND gate 22 passes this signal to the input terminal of the monostable multivibrator 24 to actuate that circuit. The 1 value signal from the AND gate 22 is also applied to one of the input terminals of the AND gate 26, but since the other input terminal of the latter AND gate is at 0, its output signal level remains at 0.

When the monostable multivibrator 24 is actuated by the signal from the AND gate 22, it produces a signal having a 1 value at its output terminal, and this signal is applied to one of the input terminals of the NOR gate 28, to the other input terminal of the AND gate 27, and to the second input terminal of the AND gate 26. The sampling pulse previously applied to the first input terminal of the AND gate 26 has already disappeared and so the initial application of the 1 level signal from the monostable multivibrator 24 does not actuate the AND gate 26. However, the output terminal of the NOR gate 28 automatically drops to 0, and this value is applied by way of the output terminal 29 to the switching means 11 to render that switching means nonconductive. The output terminal of the monostable multivibrator 33 is still at the 0 level, and so the value of the signal level applied by way of the input terminal 23 of the AND gate 22 produces another 1 level output signal to be applied to the monostable multivibrator 24 and to the AND gate 26. The 1 signal applied to the AND gate 26 from the AND gate 22 now finds the AND gate 26 enabled by the 1 level output signal from the previously actuated multivibrator 24. As a result the AND gate 26 passes a 1 level signal to actuate the second monostable multivibrator 33 and changes the output signal level of the latter from 0 to 1.

The actuation of the monostable multivibrator 33 has no effect on the NOR gate 28, which are already disabled by the fact that the output of the multivibrator 24 has the value of 1. Actuating the monostable multivibrator 33 and raising its output terminal level to 1 causes the output terminal 31 to rise from 0 to 1, and thus causes the switching means 13 to FIG. 2 to be conductive. At the same time the 1 level output signal from the monostable multivibrator 33 is inverted by the inverter 32 to produce a 0 level signal applied to one of the input terminals of the AND gate 27, thus disabling that AND gate and causing the output terminal 30 to drop to 0. This causes the switching means 12 in FIG. 2 to become nonconductive.

In the description of FIG. 4 thus far, it has been assumed that the monostable multivibrator 24 will still be in its actuated condition at the time the AND gate 22 supplies a second pulse to actuate the monostable multivibrator 33. However, the time constant of the monostable multivibrator 24 is selected so that after a predetermined interval, which is statistically related to the analog signal applied to the input terminal 1 in FIG. 2, it will return to its stable condition so that the signal level of its output terminal will again be 0 instead of 1. This 0 level signal applied to the AND gate 27 causes the output signal level of the gate to drop to 0 and thus the signal at the output terminal 30 as applied to the switching means 12 in FIG. 2 to drop to 0. This makes the switching means 12 nonconductive. When the monostable multivibrator 24 returns to its stable condition in which it has a 0 level output signal, both of the input terminals of the NOR gate 28 receive 0 level signals and thus the output terminal of the NOR gate rises to the 1 level. This level is applied by way of the output terminal 29 to the switching means 11 in FIG. 2 to cause the latter to become conductive, and thus transmit the analog signal through the zero attenuation section of the amplitude adjustment means 2 in FIG. 2.

When the second output signal from the AND gate 22 arrives at the AND gate 26 in time to actuate the second monostable multivibrator 33 before the first monostable multivibrator 24 has de-actuated itself, the output terminal 30 is the only one of the three output terminals 29–31 that is at the 1 level. The time constant of the monostable multivibrator 33 is selected to be shorter than that of the monostable multivibrator 24 so that the monostable multivibrator 33 becomes deactivated first. In addition, the multivibrator 24 is of the type known as a successively triggered multivibrator, which means that it remains in its unstable condition for a certain interval after it has been triggered, and if it is triggered a second time while it is still in its unstable state, it will remain in its unstable state for a new interval, just as if it were being triggered for the first time. Thus, if the successively triggered monostable multivibrator 24 had a time constant that kept it in its unstable condition for 0.001 second after it was actuated, or triggered, and it if were triggered a second time within that 0.001 second, even near the end of the 0.001 second, the multivibrator would start a new 0.001 second interval. Thus, the successively triggered monostable multivibrator 24 might remain in its unstable condition almost twice as long as would be expected. This is to prevent the multivibrator 24 from returning to its stable condition while the monostable multivibrator 33 is in its unstable state. This is in accordance with the fact that an analog signal would necessarily remain at its peak value for a shorter time than at an intermediate value. In the case of a signal to be handled by the circuit in FIGS. 2 and 4, this means that an analog signal having a value greater than $2V_s$ would necessarily have a value greater than $V_s$ and would stay in the range between $2V_s$ and $4V_s$ for a shorter length of time than it stayed in the range exceeding $V_s$.

FIG. 5 shows a system for reconstructing an analog signal based on digital signal encoded in the system illustrated in FIGS. 2 and 4. The digital signal input to the apparatus shown in FIG. 5 is applied to an input terminal connected to a shift register 36 that has the same bit capacity as is required by the encoding system. In the example being used for illustration, this is four-bits. The output of the shift register is obtained on four separate lines which are connected to a digital-to-analog (D/A) converter 37, and to four input terminals of a control circuit 38. The reconstructed analog signal at the output of the D/A converter 37 is applied to an amplitude adjustment circuit 39, which, in this case, is an attenuator comprising three resistors 41–43 related in the same manner as the resistors 8–10 in FIG. 2. The amplitude adjustment circuit 39 also includes three switching means 44–46 connected to a common output terminal 47.

The control circuit 38 is shown in greater detail in FIG. 6. It will be noted that the circuit in FIG. 6 is quite similar to that in FIG. 4, and in accordance with this similarity, those elements in FIG. 6 that correspond to similar elements in FIG. 4 are given the same reference numerals with the addition of the letter a.

In the operation of the combined circuits of FIGS. 5 and 6, it will be assumed that a digital signal from the terminal 6 in FIG. 2 is applied to the input terminal 34 and a sampling pulse signal corresponding to that applied to the terminal 23 in FIG. 4, is applied to the terminal 23a. The digital signal at the input terminal 34 produces four separate output signals from the shift register 36, and these pulse signal are converted by the D/A converter 37 into an analog signal.

In accordance with the fact that this invention provides for accommodating analog signals of higher amplitude than the full scale voltage, the amplitude of the output signal of the D/A converter 37 must be capable of reaching a peak value four times the full scale voltage. Hence, for low-amplitude portions of the analog signal, it is necessary to attenuate the analog output signal of the D/A converter 37. The relative resistance values of the resistors 41–43 is such that, when the switching means 44 is closed, the output analog voltage at the terminal 47 is approximately one-fourth the value of the analog voltage at the output of the D/A converter 37. Correspondingly, when the switching means 45 is closed, the value of the analog voltage at the output terminal 47 is approximately one-half the value of the analog voltage at the output of the D/A converter 37. Of course, when the switching means 46 is closed, the value of the analog voltage at the output terminal 47 is equal to the value of the analog voltage at the output of the D/A converter 37.

The switching means 44–46 are controlled, respectively, by output signal voltage levels at terminals 48–50 of the control circuits shown in FIG. 6. As before, the 1 value signal serves to make the respective switching means closed, and a 0 value signal causes the respective switching means to be open. For low-amplitude analog signals, both of the monostable multivibrators 24a and 33a are in their stable conditions with 0 signal levels at their output terminals. As a result, the terminal 48 connected to the output terminal of the NOR gate 28a has a 1 level and closes the switching means 44 to pass the attenuated analog voltage to the output terminal 47.

When the digital signal applied to the input terminal 34 reaches the value 1111, the AND gate 22a is enabled, and the next sampling signal applied to the terminal 23a is passed through the AND gate 22a to actuate, or trigger, the monostable multivibrator 24a. This causes the output voltage of the monostable multivibrator 24a to change from 0 to 1, thereby disabling the NOR gate 28a and reducing the voltage at the output terminal 48 to 0. This causes the switching means 44 to open. The 1 level signal at the output terminal of the monostable multivibrator 24a passes through the previously enabled AND gate 27a to raise the level of the output terminal 49 to 1, and thus, make the switching means 45 conductive. Thus, until the end of the unstable condition of the monostable multivibrator 24a, or until the monostable multivibrator 33a is actuated, the analog signal at the output of the D/A converter 37 is attenuated only 2:1, or 6db, by the amplitude adjustment circuit 39 before reaching the output terminal 47.

If the value of the digital signal applied to the input terminal 34 continues to increase and again reaches the value 1111 before the monostable multivibrator 24a, which is a successively triggered multivibrator, returns to its stable condition, the AND gate 22a is again enabled. The next sampling pulse applied to the input terminal 23a passes through the now-enabled AND gate 26a to trigger the monostable multivibrator 33a. This raises the output voltage level of the output terminal 50 of the monostable multivibrator 33a from 0 to 1, and causes the switching means 46 to become conductive, thereby applying the full value, or unattenuated, analog voltage from the D/A converter 37 to the output terminal 47.

At the end of the unstable interval of the monostable multivibrator 33a, that multivibrator returns to its stable condition, which causes the output terminal 50 to drop to the 0 level and the output terminal 49 to rise to the 1 level. This makes the switching means 46 nonconductive and the switching means 45 conductive. Subsequently, when the monostable multivibrator 24a reaches the end of its unstable interval, which is longer than that of the multivibrator 33a, it returns the output terminal 49 to the 0 level and the output terminal 48 to the 1 level, thereby making the switching means 45 non-conductive, and the switching meand 44 conductive.

While the invention has been described in specific terms, including the use of attenuators for the amplitude adjustment circuits, it will be understood that modifications may be made without departing from the true scope of the invention as defined by the following claims.

What is claimed is:

1. In a signal transformation system for converting between a first type of signal and a corresponding value of a second type of signal, one of said types being an analog signal and the other of said types being a digital signal within a range of values between zero and a maximum value, apparatus comprising:
   A. amplitude adjustment means for adjusting the amplitude of said analog signal, said means having at least first and second settings, the output amplitude of said analog signal from said adjustment means being greater by a predetermined ratio in said first setting than in said second setting; and
   B. control means comprising a monostable circuit having a stable condition and a unstable condition in which it remains for a predetermined time after it is actuated, said control means being connected to said amplitude adjustment means and responsive to said maximum digital value of said digital signal when said monostable circuit is in said stable condition to actuate said monostable circuit to change to said unstable condition to set said amplitude adjustment means to said second setting for the duration of the time said monostable circuit remains in its unstable condition said control means comprising a multisection digit register to receive said digital signals, an AND gate connected to said digit register to respond to a 1 condition in each section of said register, and a monostable multivibrator connected to said AND circuit to respond to 1 signals therefrom to set said amplitude adjustment means to said second setting.

2. The system of claim 1 in which said amplitude adjustment means further comprises a third setting and said control means further comprises a second monostable multivibrator connected to said first-named multivibrator and to said AND gate to be actuated when said first-named multivibrator is in its unstable condition and said AND gate responds a second time to a 1 condition in each section of said register, said second multivibrator having an unstable condition of shorter duration than said first-named multivibrator.

3. The system of claim 2 comprising, in addition, a second AND circuit having a first input terminal connected to the output terminal of said first-named AND gate and a second input terminal connected to an output terminal of said first-named multivibrator and an output terminal connected to a triggering input terminal of said second multivibrator, whereby said second multivibrator is connected to said first-named AND gate and said first-named multivibrator by said second AND gate.

4. The system of claim 2 in which said first-named multivibrator is a successively triggered monostable multivibrator.

5. The system of claim 2 in which said amplitude adjustment means comprises:
A. first, second, and third switching means;
B. an input terminal to receive an analog signal;
C. an output terminal; and
D. first, second, and third signal transmission circuits connected to said first, second, and third switching means respectively, to be connected thereby in circuit with said input terminal and said output terminal and comprising said first, second, and third settings, the amplitude of said analog signal applied to said input terminal to be transmitted to said output terminal by said second signal transmission circuit being less than by said first signal transmission circuit and second switching means and greater than by said third signal transmission circuit and said third switching means.

6. The system of claim 5 comprising, in addition:
A. a NOR gate having input terminals connected to said first-named and second monostable multivibrators and an output terminal connected to said third switching means to actuate the latter when both of said multivibrators are in their stable conditions;
B. an inverter having its input terminal connected to an output terminal of said second multivibrator;
C. a third AND gate comprising a first input terminal connected to an output terminal of said first-named multivibrator and a second input terminal connected to the output terminal of said inverter and further comprising an output terminal connected to said second switching means to actuate said second switching means when said first-named multivibrator is in its unstable condition and said second multivibrator is in its stable condition; and
D. a connection from said output terminal of said second multivibrator to said third switching means when said second multivibrator is in its unstable condition.

* * * * *